(12) United States Patent
Wu

(10) Patent No.: US 11,791,163 B1
(45) Date of Patent: Oct. 17, 2023

(54) MANUFACTURING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/807,724

(22) Filed: Jun. 19, 2022

Related U.S. Application Data

(63) Continuation of application No. PCT/CN2022/097671, filed on Jun. 8, 2022.

(30) Foreign Application Priority Data

Apr. 13, 2022 (CN) .......................... 202210385869.7

(51) Int. Cl.
- *H01L 21/308* (2006.01)
- *H01L 21/8234* (2006.01)
- *H01L 21/311* (2006.01)
- *H10B 12/00* (2023.01)

(52) U.S. Cl.
CPC .... *H01L 21/3086* (2013.01); *H01L 21/31116* (2013.01); *H01L 21/823481* (2013.01); *H10B 12/488* (2023.02)

(58) Field of Classification Search
None
See application file for complete search history.

(56) References Cited

U.S. PATENT DOCUMENTS

| | | |
|---|---|---|
| 6,852,620 B2 | 2/2005 | Kim et al. |
| 11,037,800 B2 | 6/2021 | Tomoyama et al. |
| 11,114,180 B1 | 9/2021 | Lin et al. |
| 11,276,442 B2 | 3/2022 | Ito et al. |
| 11,416,333 B2 | 8/2022 | Lam et al. |
| 2012/0282751 A1 | 11/2012 | Oh et al. |

(Continued)

FOREIGN PATENT DOCUMENTS

| | | |
|---|---|---|
| CN | 109148376 A | 1/2019 |
| CN | 114005791 A | 2/2022 |

OTHER PUBLICATIONS

China International Search Report and written opinion in Application No. PCT/CN2022/097671, dated Dec. 20, 2022.

(Continued)

*Primary Examiner* — Roberts P Culbert
(74) *Attorney, Agent, or Firm* — SYNCODA LLC; Feng Ma

(57) ABSTRACT

A manufacturing method of a semiconductor structure includes: providing a target layer; forming a plurality of first mask patterns on a top surface of the target layer; forming a plurality of second mask patterns above the target layer, where each of the second mask patterns covers at least a part of a top surface of each of the first mask patterns and a part of the top surface of the target layer in an extension direction of the second mask pattern; performing a first etching on the target layer based on the second mask patterns; removing the second mask patterns; and performing a second etching on the target layer based on the first mask patterns.

14 Claims, 15 Drawing Sheets

(56) References Cited

U.S. PATENT DOCUMENTS

| | | |
|---|---|---|
| 2013/0260562 A1* | 10/2013 | Park ................... H01L 21/308 |
| | | 438/702 |
| 2017/0161143 A1 | 6/2017 | Reed et al. |
| 2021/0143020 A1* | 5/2021 | Lee ................... H01L 21/0337 |
| 2022/0277785 A1 | 9/2022 | Chi et al. |

OTHER PUBLICATIONS

China International Search Report and written opinion in Application No. PCT/CN2022/123944, dated Dec. 20, 2022.

* cited by examiner

US 11,791,163 B1

MANUFACTURING METHOD OF SEMICONDUCTOR STRUCTURE AND SEMICONDUCTOR STRUCTURE

CROSS-REFERENCE TO RELATED APPLICATIONS

The present disclosure is a continuation application of International Patent Application No. PCT/CN2022/097671 filed on Jun. 8, 2022, which claims priority to Chinese Patent Application No. 202210385869.7 filed on Apr. 13, 2022. The disclosures of these applications are hereby incorporated by reference in their entirety.

BACKGROUND

With the continuous development of integrated circuits (ICs), an electronic component in the IC has an increasingly small feature size and an increasingly high integration density, such that the IC has a higher degree of integration. At present, the feature size of the electronic component has been reduced to a physical limit that a mainstream photolithography technique can achieve. Resolution of the photolithography technique cannot meet a manufacturing requirement of the IC, and a manufacturing process of the IC is facing a great challenge.

SUMMARY

The present disclosure relates to, but is not limited to, a manufacturing method of a semiconductor structure and a semiconductor structure.

A first aspect of the present disclosure provides a manufacturing method of a semiconductor structure, including:
 providing a target layer;
 forming a plurality of first mask patterns on a top surface of the target layer, where any two adjacent ones of the first mask patterns are spaced apart in a first direction;
 forming a plurality of second mask patterns above the target layer, where each of the second mask patterns extends along the first direction, the second mask patterns are spaced apart from each other, and each of the second mask patterns covers at least a part of a top surface of each of the first mask patterns and a part of the top surface of the target layer in an extension direction of the second mask pattern;
 performing a first etching on the target layer based on the second mask patterns; and
 performing a second etching on the target layer based on the first mask patterns.

A second aspect of the present disclosure provides a semiconductor structure. The semiconductor structure is manufactured by the manufacturing method of a semiconductor structure in the first aspect.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Exemplary embodiments of the present disclosure provide a manufacturing method of a semiconductor structure. A target layer is etched by using a second mask pattern and a first mask pattern as a mask separately, to form a more sophisticated repetitive structure with a higher density on the target layer. The manufacturing method in the embodiments reduces difficulty of forming the repetitive structure and is conducive to forming an IC with a high degree of integration.

Figure 1:
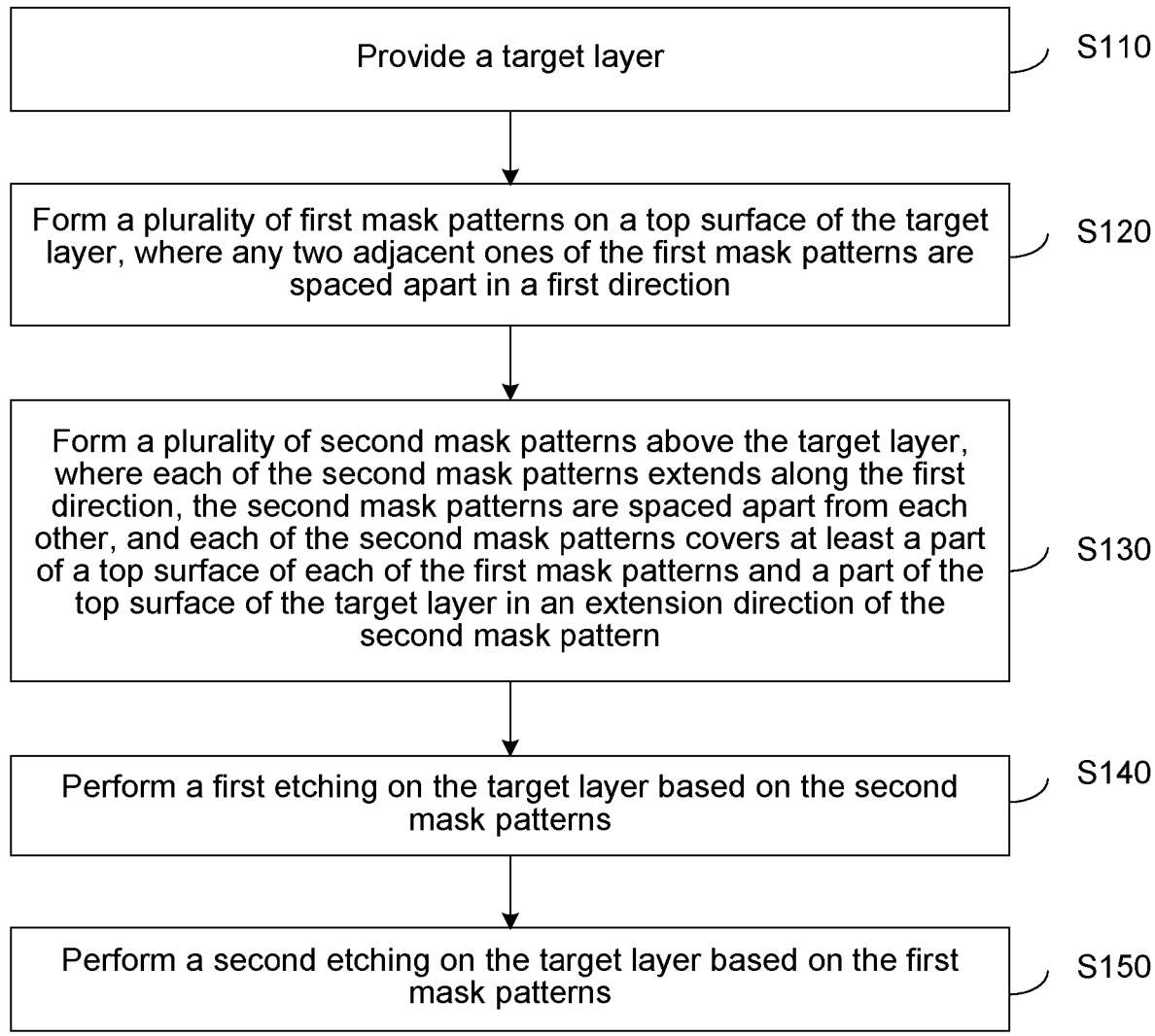
FIG. 1 is a flowchart of a manufacturing method of a semiconductor structure according to an exemplary embodiment.

FIG. 1 is a flowchart of a manufacturing method of a semiconductor structure according to an exemplary embodiment of the present disclosure. As shown in FIG. 1, the manufacturing method of a semiconductor structure in this exemplary embodiment of the present disclosure includes the following steps.

Step S110: Provide a target layer.

Figure 13:
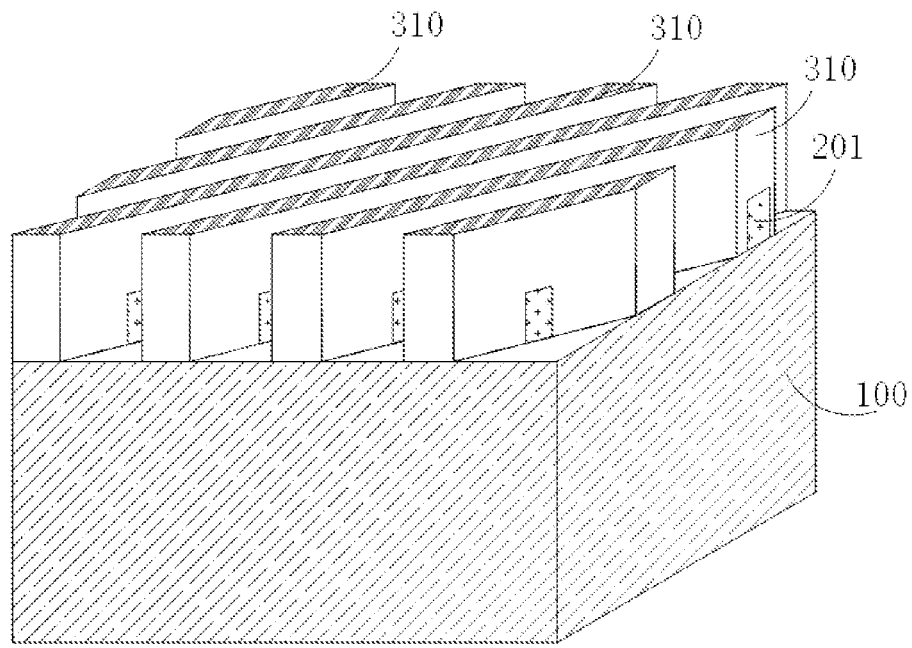
FIG. 13 is a schematic diagram of forming a second mask pattern according to an exemplary embodiment.

Referring to FIG. 13, the target layer 100 is a to-be-etched material layer that needs to be patterned, and the target layer 100 may be any structure for forming a semiconductor element.

The target layer 100 may be a semiconductor substrate. A material of the semiconductor substrate may be silicon (Si), germanium (Ge), silicon-germanium (GeSi), or silicon carbide (SiC); or may be silicon on insulator (SOI) or germanium on insulator (GOI); or may be another material such as gallium arsenide or other III-V compounds. The semiconductor substrate may be doped with some impurity ions based on a requirement, and the impurity ions may be N-type impurity ions or P-type impurity ions.

The target layer 100 may alternatively be a material layer for forming the semiconductor element, such as a dielectric layer or a metal layer. For example, the material layer may be an amorphous carbon layer, an oxide layer, a nitride layer, a copper layer, a tungsten layer, an aluminum layer, or the like, but is not limited thereto.

Step S120: Form a plurality of first mask patterns on a top surface of the target layer, where any two adjacent ones of the first mask patterns are spaced apart in a first direction.

Figure 14:
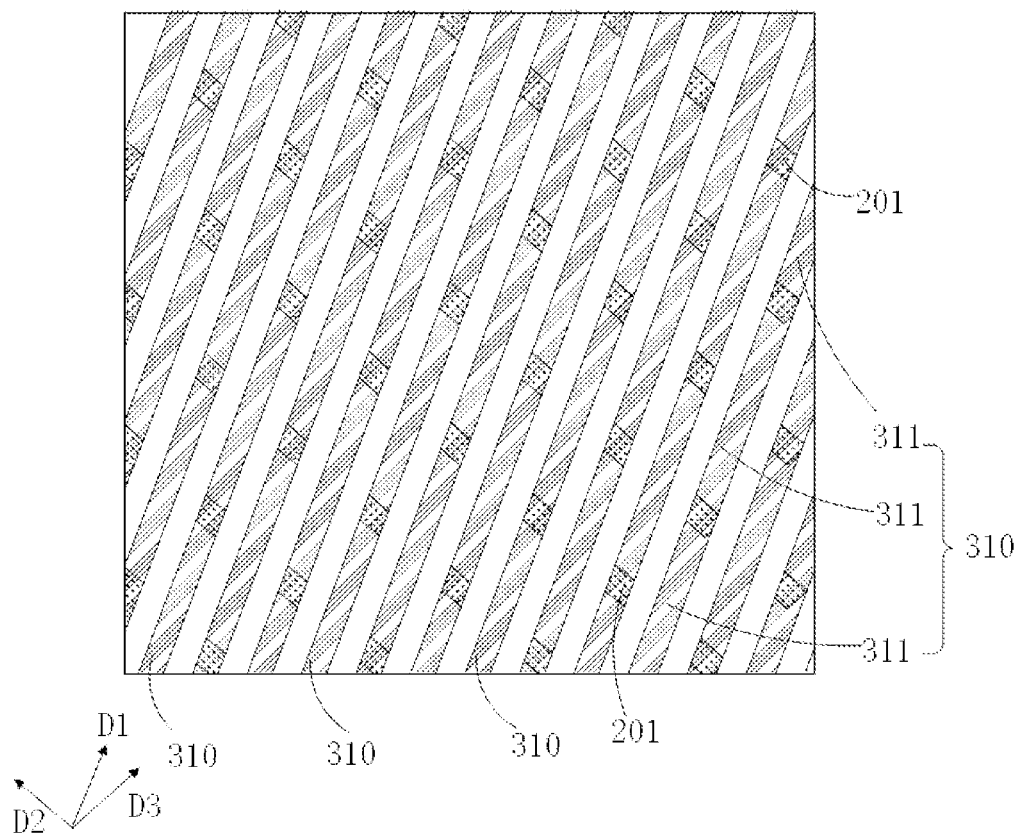
FIG. 14 is a top view of a second mask pattern and a first mask pattern according to an exemplary embodiment.

Referring to FIG. 13 and FIG. 14, in this embodiment, the first mask patterns 201 are independently disposed on the top surface of the target layer 100. In the first direction D1, the first mask patterns 201 are arranged in a plurality of rows. The any two adjacent ones of the first mask patterns 201 are spaced apart in the first direction D1.

Step S130: Form a plurality of second mask patterns above the target layer, where each of the second mask patterns extends along the first direction, the second mask patterns are spaced apart from each other, and each of the second mask patterns covers at least a part of a top surface of each of the first mask patterns and a part of the top surface of the target layer in an extension direction of the second mask pattern.

Referring to FIG. 13 and FIG. 14, each of the second mask patterns 310 formed in this embodiment is correspondingly disposed on a row of first mask patterns 201, and each of the second mask patterns 310 is correspondingly filled in a part of a region between two adjacent first mask patterns 201 in a same row.

In this embodiment, projection of each of the second mask patterns 310 on the target layer 100 is divided into a plurality of independently disposed sub-patterns 311 by projection of the first mask pattern 201 in the extension direction of the second mask pattern 310 on the target layer 100. In other embodiments, shapes and arrangement densities of the first mask pattern 201 and the second mask pattern 310 are set based on a to-be-formed semiconductor structure.

Step S140: Perform a first etching on the target layer based on the second mask patterns.

Figure 15:
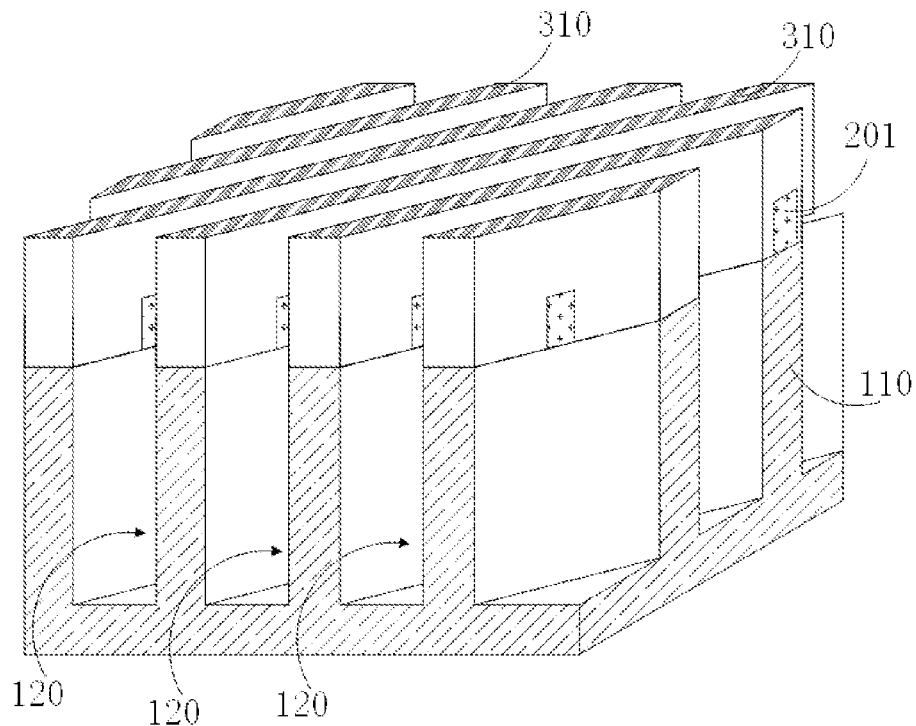
FIG. 15 is a schematic diagram of performing first etching on a target layer according to an exemplary embodiment.

Referring to FIG. 13, FIG. 14, and FIG. 15, in this embodiment, the target layer 100 is etched by the second mask patterns 310 as a mask, a part of the target layer 100 exposed by the second mask patterns 310 is removed, the second mask patterns 310 are extended to the target layer 100, and a plurality of independently disposed structures are formed in the reserved target layer 100. The first etching may be performed through dry etching or wet etching.

Step S150: Perform a second etching on the target layer based on the first mask patterns.

First, the second mask patterns 310 are removed through dry etching or wet etching to expose the first mask patterns 201 and the top surface of the target layer 100 covered by the second mask patterns 310.

Figure 17:
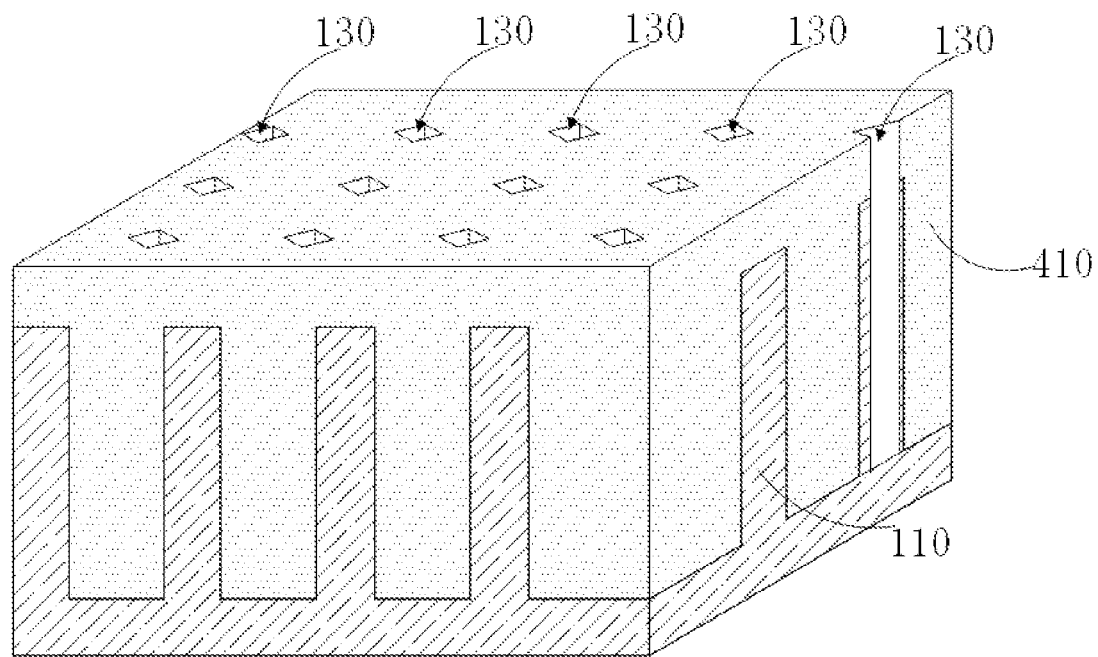
FIG. 17 is a schematic diagram of performing second etching on a target layer according to an exemplary embodiment.
Figure 20:
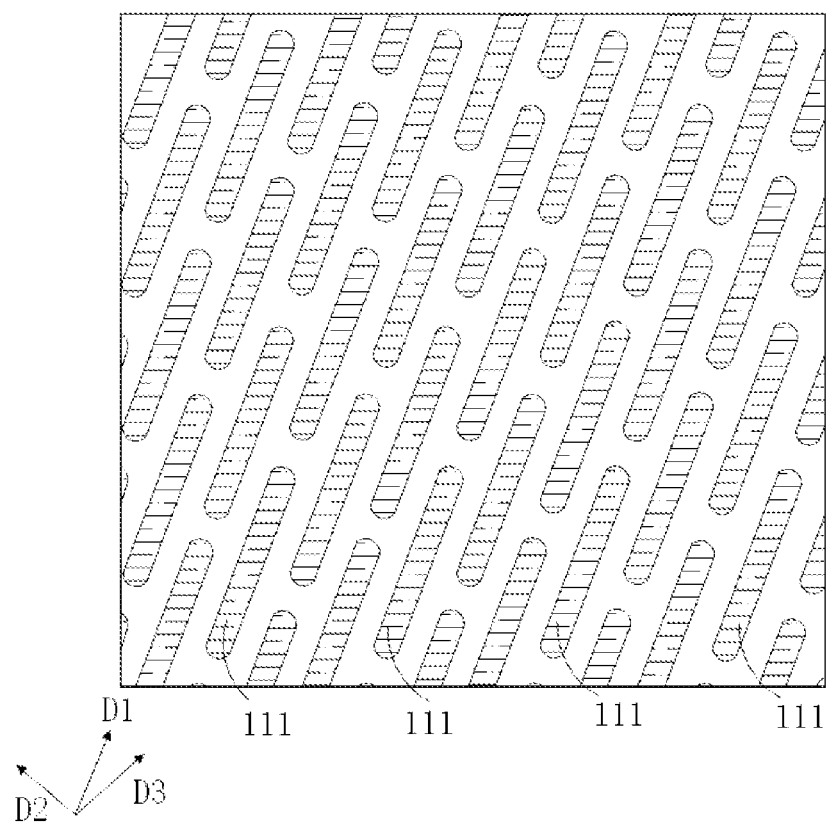
FIG. 20 is a top view of an active region according to an exemplary embodiment.

Then, referring to FIG. 17 and FIG. 20, the first mask patterns 201 and a part of the target layer 100 covered by the first mask patterns 201 are removed through etching, to extend the first mask patterns 201 to the target layer 100, and a plurality of independently disposed substructures are formed in the target layer 100 reserved after etching.

According to the manufacturing method of a semiconductor structure in this embodiment, two layers of masks, namely, the first mask pattern and the second mask pattern, are formed above the target layer, and the target layer is etched based on the second mask pattern and the first mask pattern separately, to form a high-density repetitive structure in the target layer. Compared with a scheme of directly forming an etching mask by a photolithography process, the manufacturing method in this embodiment has a lower requirement on resolution accuracy of the photolithography process, reducing process difficulty and process costs.

Figure 2:
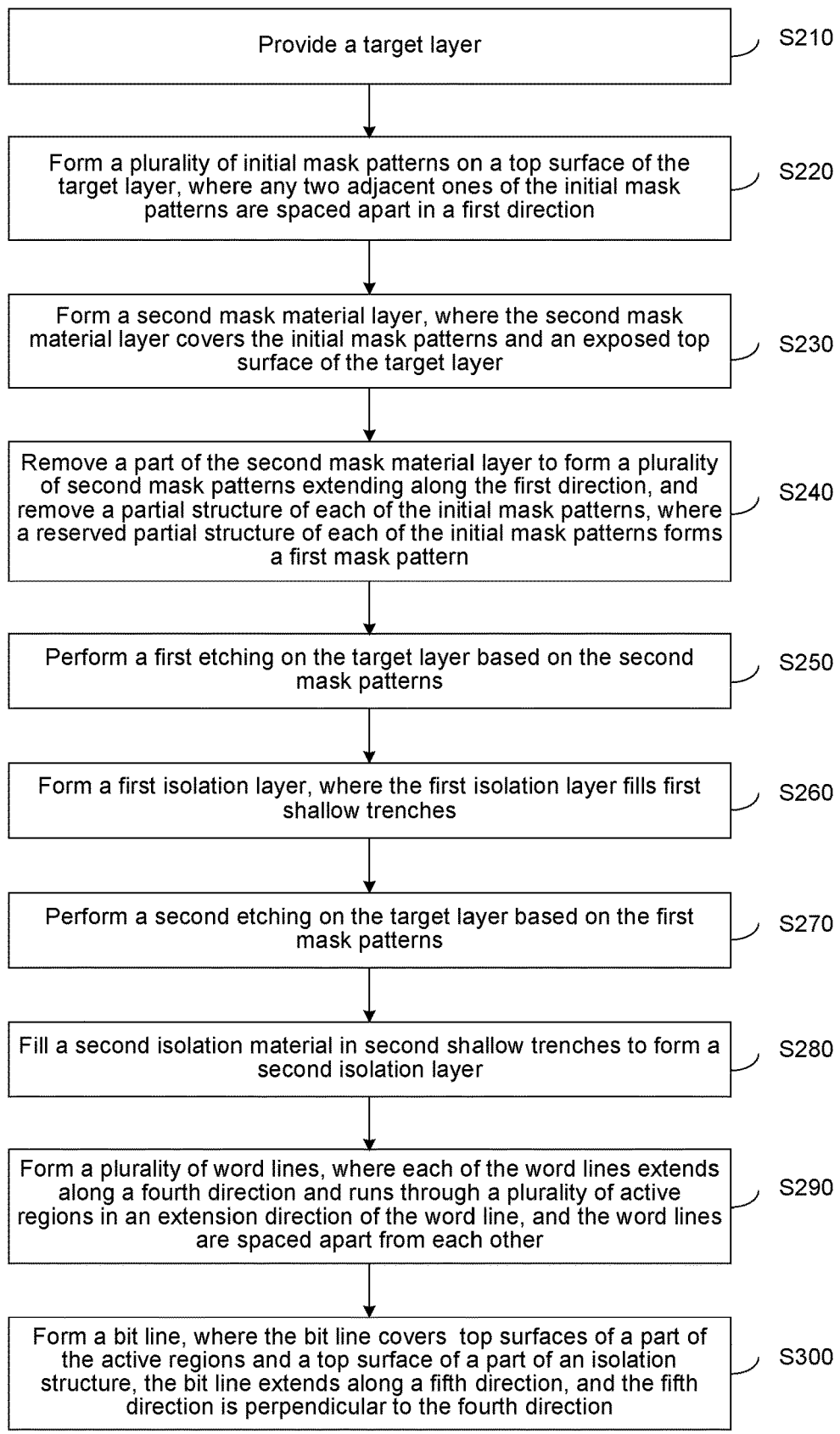
FIG. 2 is a flowchart of a manufacturing method of a semiconductor structure according to an exemplary embodiment.

FIG. 2 is a flowchart of a manufacturing method of a semiconductor structure according to an exemplary embodiment of the present disclosure. FIG. 3 to FIG. 22 are schematic diagrams of various stages of the manufacturing method of a semiconductor structure in this embodiment. The manufacturing method of a semiconductor structure in this embodiment is described below with reference to FIG. 3 to FIG. 22.

An exemplary embodiment of the present disclosure provides a manufacturing method of a semiconductor structure. A semiconductor structure is not limited in this embodiment. This embodiment is described below by taking a dynamic random access memory (DRAM) as an example to form an active region in the semiconductor structure, but this embodiment is not limited thereto. The semiconductor structure in this embodiment may also be another structure.

An exemplary embodiment of the present disclosure provides a manufacturing method of a semiconductor structure. As shown in FIG. 2, the manufacturing method of a semiconductor structure includes the following steps.

Step S210: Provide a target layer.

Figure 3:
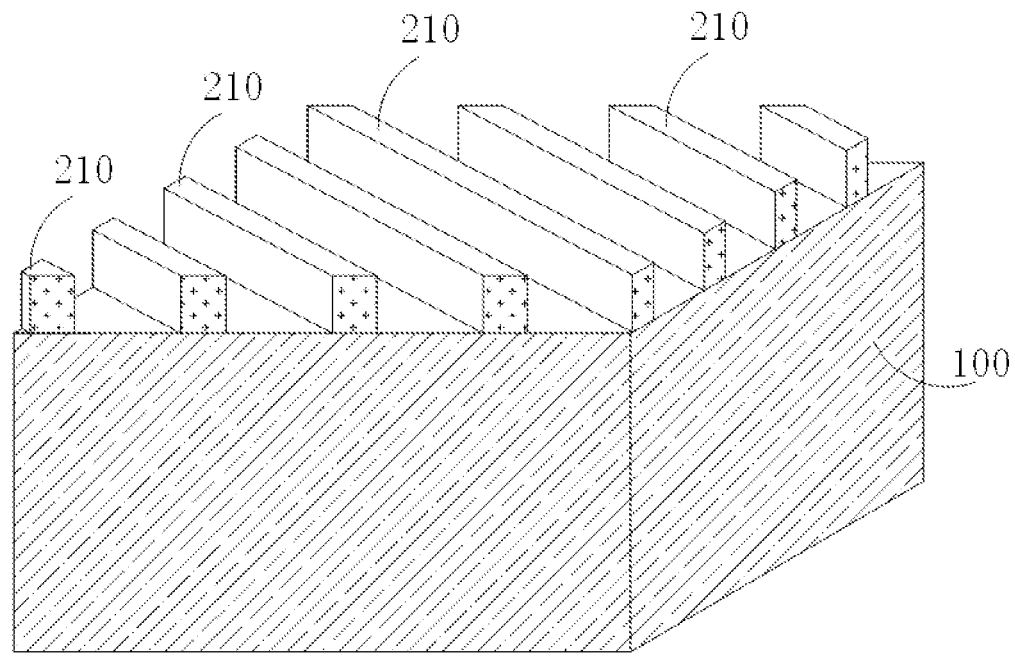
FIG. 3 is a schematic diagram of forming a first line structure on a target layer according to an exemplary embodiment.

As shown in FIG. 3, in this embodiment, the target layer 100 is a semiconductor substrate, and a material of the semiconductor substrate is the same as that of the semiconductor substrate in the above embodiment.

Step S220: Form a plurality of initial mask patterns on a top surface of the target layer, where any two adjacent ones of the initial mask patterns are spaced apart in a first direction.

The initial mask patterns 211 may be formed on the top surface of the target layer 100 by performing the following steps.

Step S221: Form a cross structure on the target layer, where the cross structure includes an overlapping region.

First, as shown in FIG. 3, a plurality of first line structures 210 are formed on the top surface of the target layer 100, where each of the first line structures 210 extends along a second direction D2, the first line structures 210 are spaced apart in a direction perpendicular to the second direction D2, and the first direction D1 obliquely intersects the second direction D2.

A dielectric material can be deposited by a chemical vapor deposition (CVD) process or a physical vapor deposition (PVD) process, to form a first dielectric layer (not shown in the figure) on the top surface of the target layer 100. A material of the first dielectric layer may include silicon nitride and/or silicon oxide.

Figure 8:
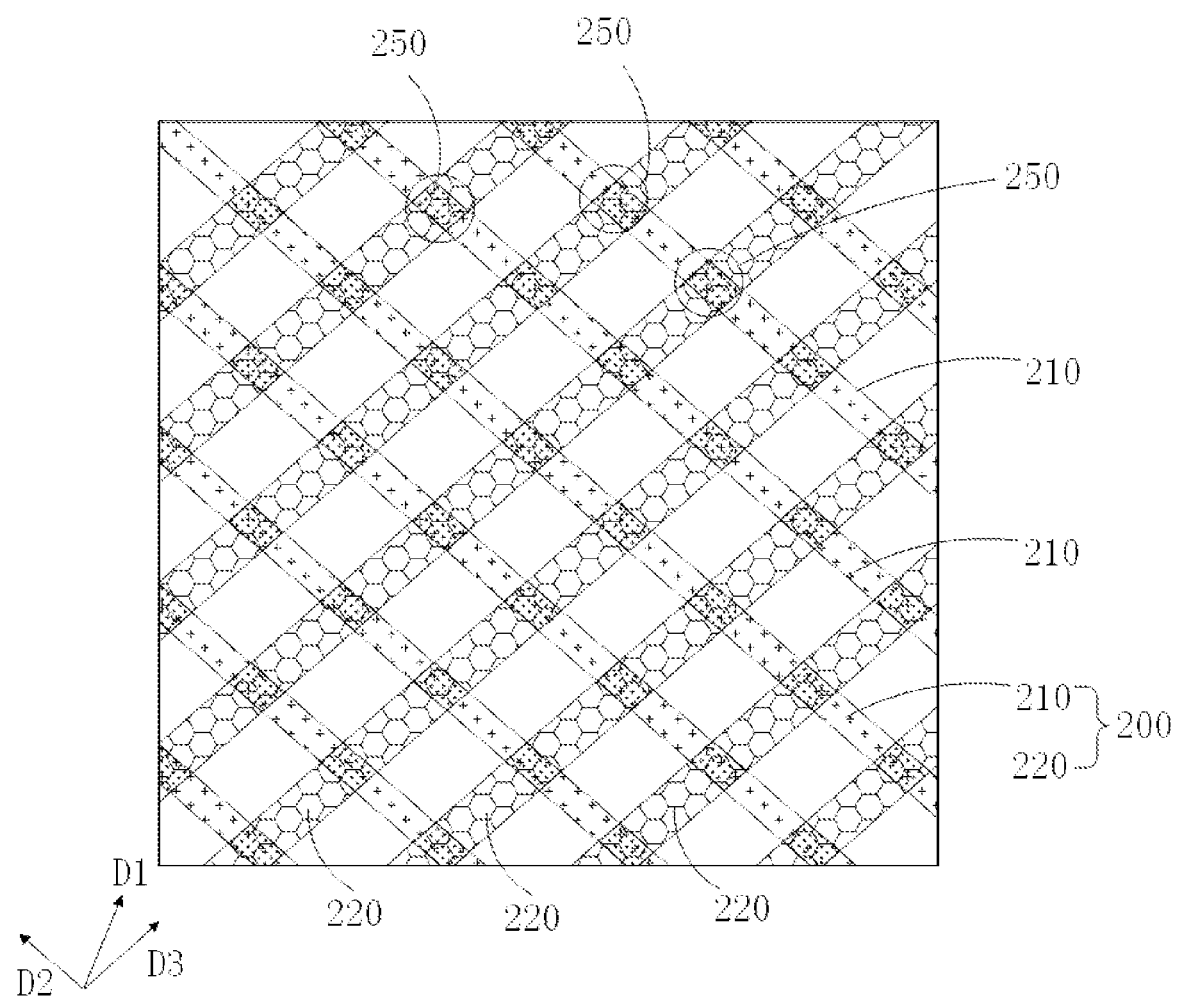
FIG. 8 is a top view of a formed cross structure according to an exemplary embodiment.

Referring to FIG. 8, a first photomask (not shown in the figure) is formed on a top surface of the first dielectric layer. A part of the first dielectric layer is removed through etching based on the first photomask, and the independently disposed first line structures 210 are formed in the reserved first dielectric layer. Each of the first line structures 210 extends along the second direction D2, and two adjacent ones of the first line structures 210 are spaced apart in the direction perpendicular to the second direction D2.

Figure 4:
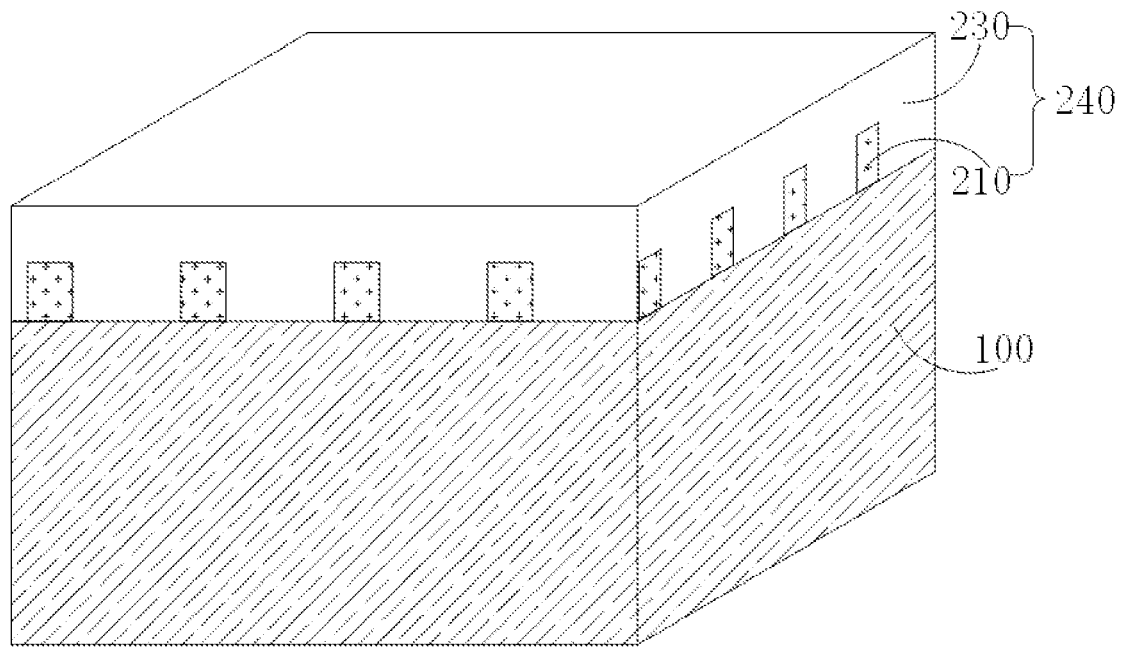
FIG. 4 is a schematic diagram of forming a first stratification structure according to an exemplary embodiment.

Then, as shown in FIG. 4, an auxiliary material can be deposited by an atomic layer deposition (ALD) process or the CVD process. The auxiliary material forms an auxiliary layer 230. The auxiliary layer 230 covers the first line structures 210 and fills trenches between adjacent first line structures 210. The auxiliary layer 230 and the first line structures 210 jointly form a first stratification structure 240. After that, a top surface of the first stratification structure 240 is polished into a plane, such that second line structures 220 are subsequently formed on the top surface of the first stratification structure 240. A material of the auxiliary layer 230 may include but is not limited to silicon nitride and silicon oxynitride. In some embodiments, the auxiliary layer 230 may alternatively be formed by using another process. For example, the auxiliary layer 230 may be formed by performing spin coating on the auxiliary material by using a spin coating process, and the material of the auxiliary layer 230 may be spin on carbon (SOC).

Figure 5:
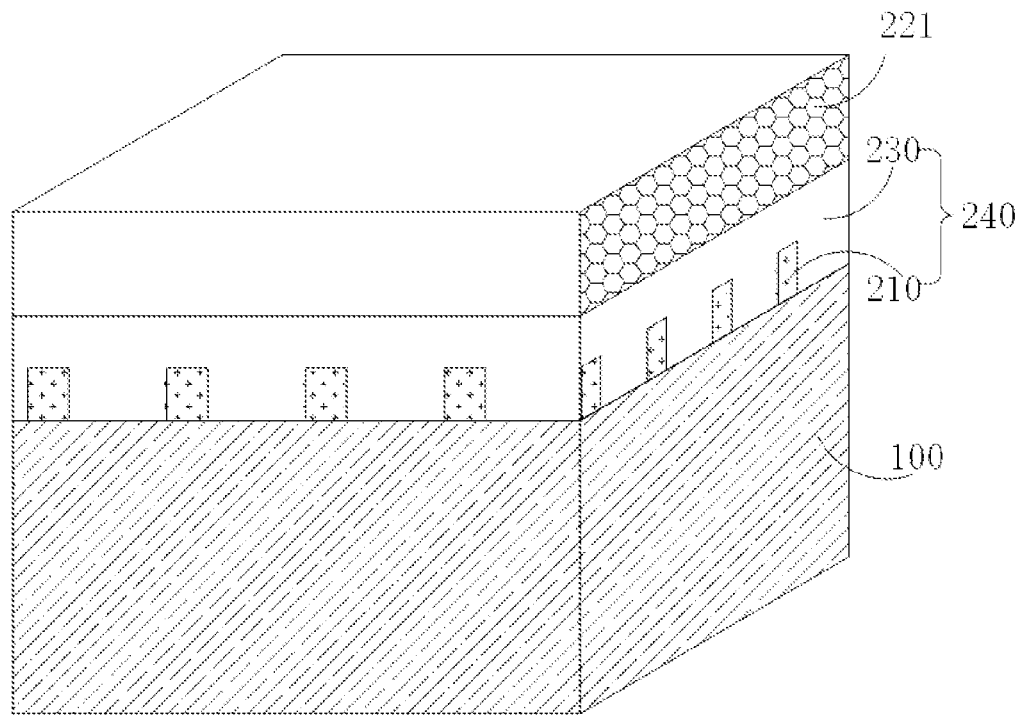
FIG. 5 is a schematic diagram of forming a second dielectric layer according to an exemplary embodiment.

As shown in FIG. 5, a dielectric material can be deposited by using the CVD process or the PVD process, to form a second dielectric layer 221 on the top surface of the target layer 100. A material of the second dielectric layer 221 may include silicon nitride and/or silicon oxide.

Figure 6:
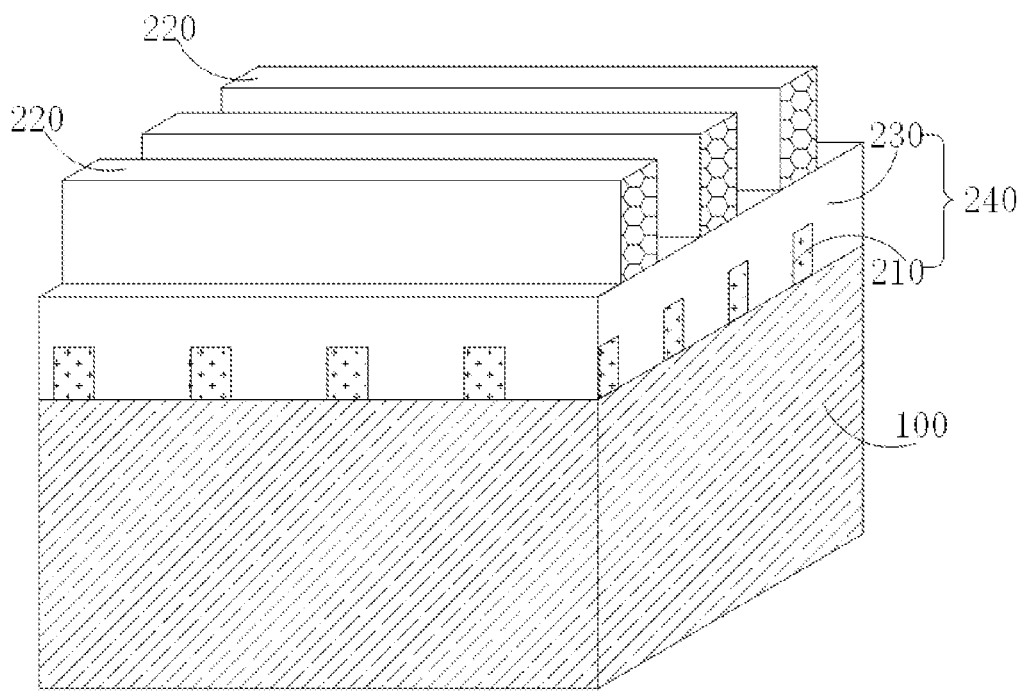
FIG. 6 is a schematic diagram of forming a second line structure according to an exemplary embodiment.
Figure 7:
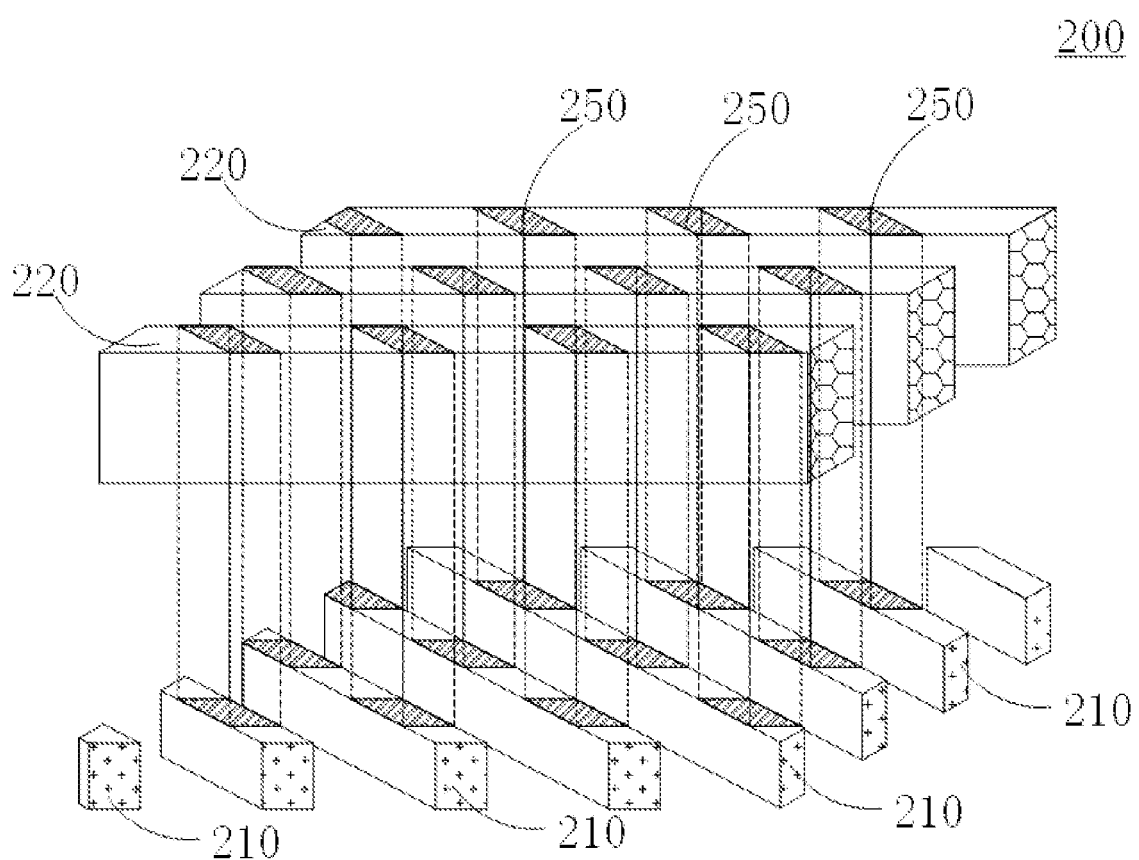
FIG. 7 is a schematic diagram of a formed cross structure according to an exemplary embodiment.

As shown in FIG. 6, FIG. 7, and FIG. 8, a second photomask (not shown in the figure) is formed on a top surface of the second dielectric layer 221. A part of the second dielectric layer 221 is removed through etching based on the second photomask, and a plurality of second line structures 220 are formed in the reserved second dielectric layer 221. The second line structures 220 are located above the first line structures 210 and are independently disposed. Each of the second line structures 220 extends along a third direction D3, and the second line structures 220 are spaced apart in a direction perpendicular to the third direction D3. The first direction D1 obliquely intersects the third direction D3.

As shown in FIG. 7 and FIG. 8, the first line structure 210 and the second line structure 220 form the cross structure 200 in space above the target layer 100, and there is an overlapping part between the first line structure 210 and the second line structure 220 in the space above the target layer 100. The overlapping part is the overlapping region 250 of the cross structure 200.

Step S222: Remove a part of the cross structure to reserve a part of the overlapping region, and form the initial mask patterns in the reserved overlapping region.

Figure 9:
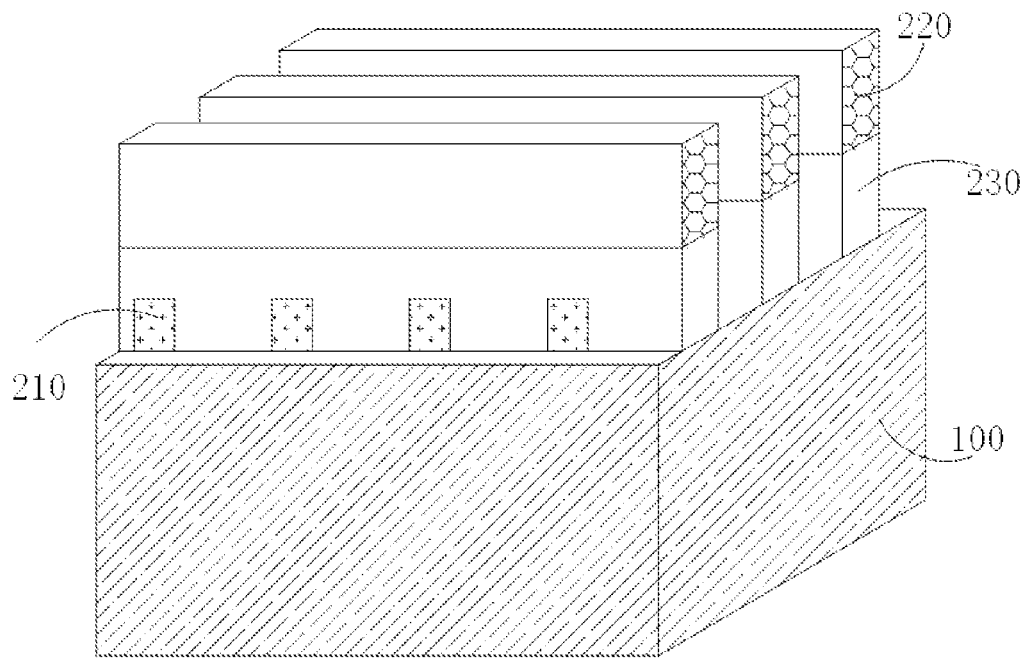
FIG. 9 is a top view of etching a first stratification structure based on a second line structure according to an exemplary embodiment.

The part of the cross structure 200 may be removed by the following method:

As shown in FIG. 9, referring to FIG. 6, the first stratification structure 240 is etched based on the second line structures 220, the auxiliary layer 230 and the first line structures 210 that are exposed by the second line structures 220 are removed, and a pattern of the second line structures 220 is transferred to the first stratification structure 240. The reserved first stratification structure 240 includes a part of the first line structures 210 and a part of the auxiliary layer 230, where the reserved part of the first line structure 210 corresponds to the overlapping region 250 of the cross structure 200.

Figure 10:
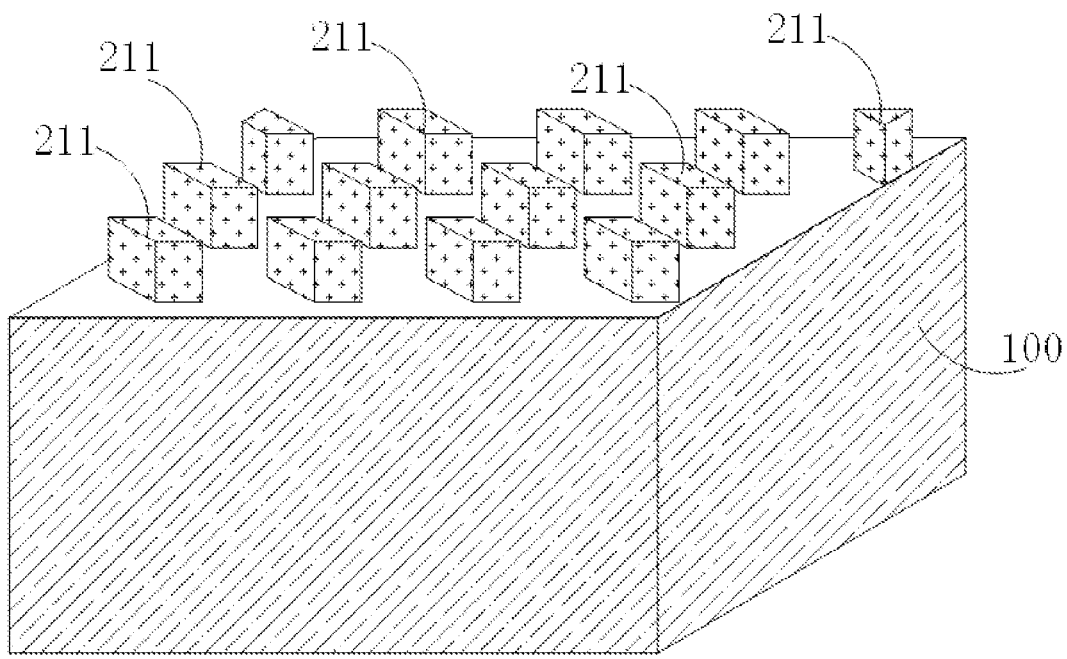
FIG. 10 is a schematic diagram of forming an initial mask pattern according to an exemplary embodiment.

After that, as shown in FIG. 10, referring to FIG. 6 and FIG. 9, the whole second line structure 220 is dry or wet etched to expose the reserved first stratification structure 240. The auxiliary layer 230 in the reserved first stratification structure 240 can be removed through dry etching or wet etching. The mutually independent initial mask patterns 211 are formed in the reserved first line structures 210, and the initial mask patterns 211 formed in this embodiment are arranged in a plurality of rows along the first direction D1.

In this embodiment, the stacked first line structures 210 and second line structures 220 are formed above the target layer 100. The second line structures 220 and the first line structures 210 are partially etched, and only the overlapping region of the first line structure 210 and the second line structure 220 is reserved, such that the initial mask pattern 211 with a small feature size is formed. In this way, a size of a first mask pattern 201 (referring to FIG. 14) formed based on the initial mask pattern 211 formed in this embodiment is smaller. In a subsequent second etching process, the target layer 100 can be etched based on the first mask patterns 201 to form a repetitive structure with a larger repetition density and a smaller size.

Step S230: Form a second mask material layer, where the second mask material layer covers the initial mask patterns and an exposed top surface of the target layer.

Figure 11:
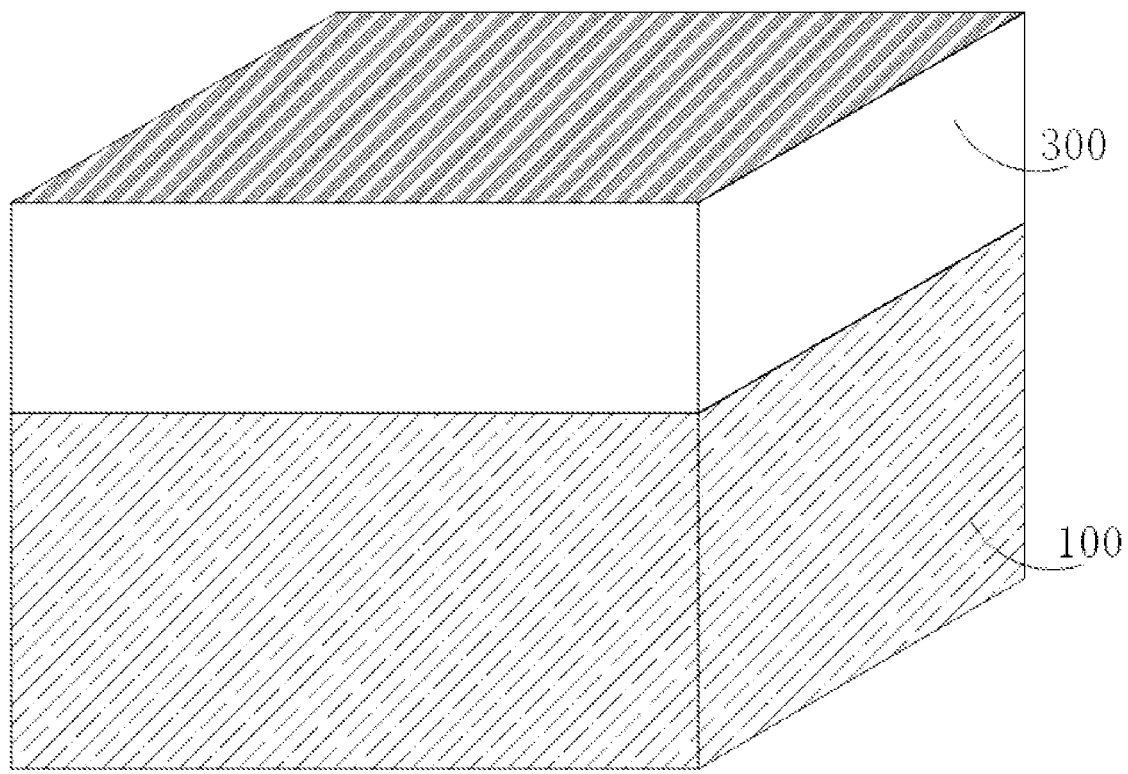
FIG. 11 is a schematic diagram of forming a second mask material layer according to an exemplary embodiment.

As shown in FIG. 11, referring to FIG. 10, the second mask material can be deposited by using the CVD process or the PVD process, to form the second mask material layer 300. The second mask material layer 300 covers the initial mask patterns 211 and the exposed top surface of the target layer 100.

Step S240: Remove a part of the second mask material layer to form a plurality of second mask patterns extending along the first direction, and remove a partial structure of each of the initial mask patterns, where a reserved partial structure of each of the initial mask patterns forms the first mask pattern.

Figure 12:
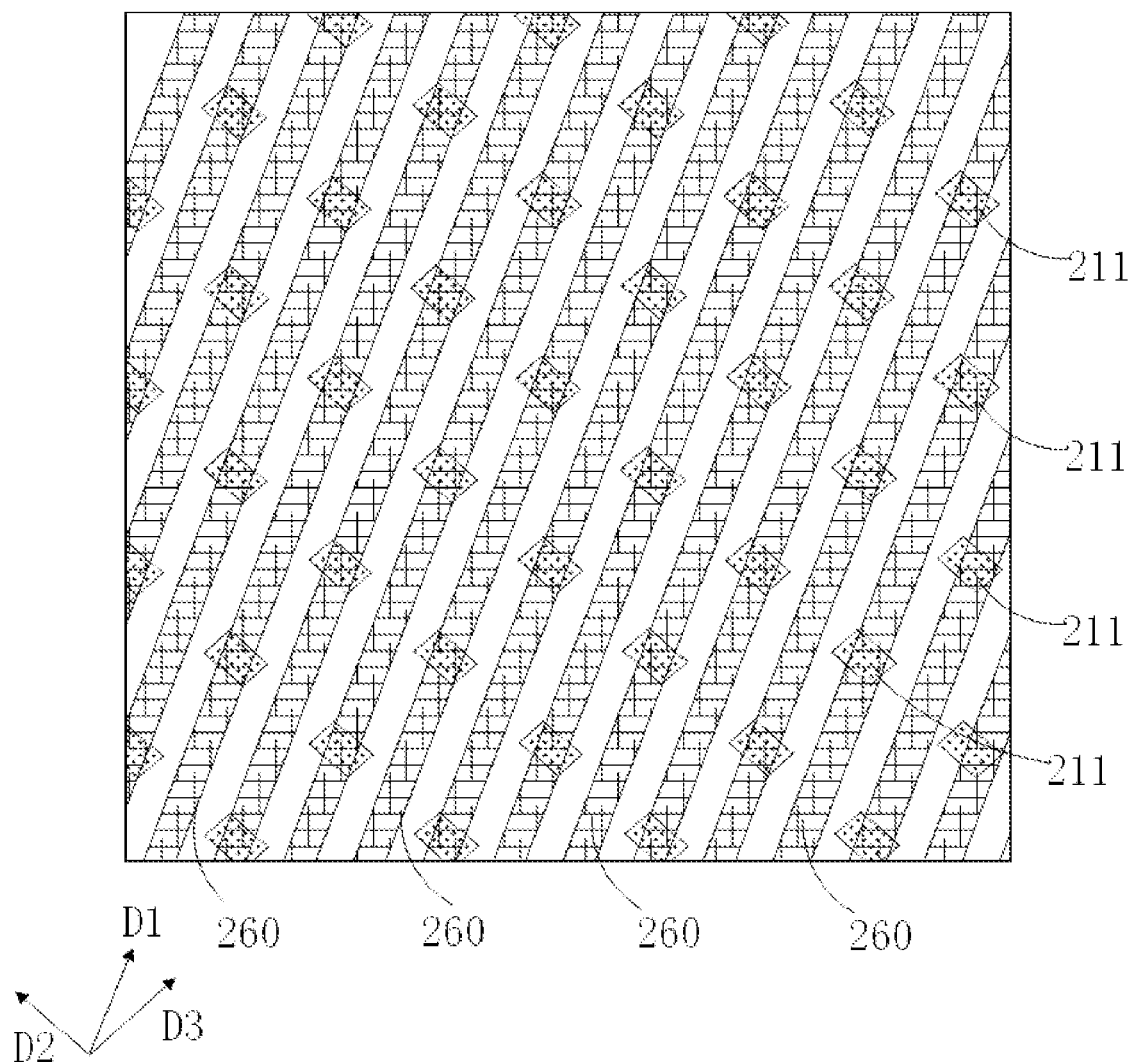
FIG. 12 is a top view of a third photomask and an initial mask pattern according to an exemplary embodiment.

As shown in FIG. 12, referring to FIG. 11, a third photomask 260 is formed on a top surface of the second mask material layer 300, and the second mask material layer 300 and the initial mask patterns 211 are etched based on the third photomask 260. As shown in FIG. 13 and FIG. 14, the second mask patterns 310 extending along the first direction D1 are formed in the reserved second mask material layer 300, and the reserved partial structure of each of the initial mask patterns 211 forms the first mask pattern 201. In a direction perpendicular to the first direction D1, any two adjacent ones of the second mask patterns 310 are spaced apart by a first trench 320. The first trench 320 exposes a part of the top surface of the target layer 100.

As shown in FIG. 14, the projection of each of the second mask patterns 310 on the target layer 100 is divided into the independently disposed sub-patterns 311 by the projection of the first mask pattern 201 in the extension direction of the second mask pattern 310 on the target layer 100. In this way, the target layer 100 is subsequently etched based on the first mask patterns 201 and the second mask patterns 310 to form a plurality of independently disposed active regions 111.

In this embodiment, the first mask patterns 201 and the second mask patterns 310 are formed at the same time. The projection of each of the second mask patterns 310 on the target layer 100 is divided into the independently disposed sub-patterns 311 by the projection of the first mask pattern 201 in the extension direction of the second mask pattern 310 on the target layer 100, and the projection of the first mask pattern 201 on the target layer 100 is located in the projection of the second mask pattern 310 on the target layer 100. Positions and a distribution of the first mask patterns 201 and the second mask patterns 310 formed in this embodiment can ensure that the target layer 100 is subsequently etched based on the first mask patterns 201 and the second mask patterns 310 to form the active regions 111.

Step S250: Perform a first etching on the target layer based on the second mask patterns.

As shown in FIG. 15, referring to FIG. 13, in this embodiment, the target layer 100 is etched by the second mask patterns 310 as a mask, to remove a part of the target layer 100 exposed by the second mask patterns 310, and a reserved part of the target layer 100 is etched to form a plurality of active strips 110 extending along the first direction D1, where two adjacent ones of the active strips 110 are spaced apart by a first shallow trench 120 in the direction perpendicular to the first direction D1. The first etching may be performed through dry etching or wet etching.

Step S260: Form a first isolation layer, where the first isolation layer fills the first shallow trenches.

Referring to FIG. 15, the second mask patterns 310 are removed through dry etching or wet etching to expose the first mask patterns 201 and the top surface of the target layer 100 covered by the second mask patterns 310.

Figure 16:
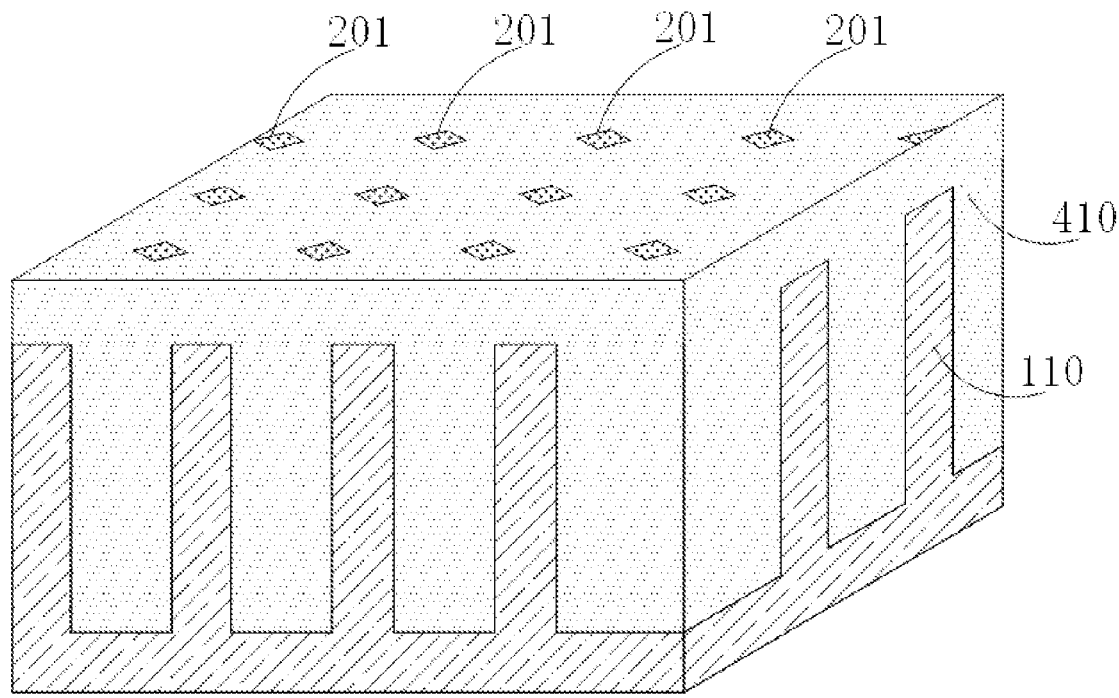
FIG. 16 is a schematic diagram of forming a first isolation layer according to an exemplary embodiment.

As shown in FIG. 16, in this embodiment, a first isolation material can be deposited by using any one of the ALD process, the CVD process, or the PVD process, to form the first isolation layer 410, where the first isolation layer 410 fills the first shallow trenches 120 and covers the first mask patterns 201 and top surfaces of the active strips 110 exposed by the first mask patterns 201. The first isolation material may be one of silicon oxide, silicon nitride, or silicon oxynitride. Then, a top surface of the first isolation layer 410 is planarized by using a chemical mechanical polish (CMP) process, to expose top surfaces of the first mask patterns 201, such that second etching can be subsequently performed on the active strips 110 based on the first mask patterns 201.

Step S270: Perform the second etching on the target layer based on the first mask patterns.

As shown in FIG. 17, referring to FIG. 16, the performing a second etching on the target layer 100 based on the first mask patterns 201 may be implemented by the following method: removing the first mask patterns 201 and a part of the active strips 110 covered by the first mask patterns 201, where the independently disposed active regions 111 are formed in a reserved part of the active strips 110, the active regions 111 extend along the first direction D1, two adjacent ones of the active regions 111 are spaced apart by a second shallow trench 130 in the first direction D1, and the second shallow trench 130 extends the first mask pattern 201 to the active strip 110.

Step S280: Fill the second shallow trenches with a second isolation material to form a second isolation layer.

Figure 18:
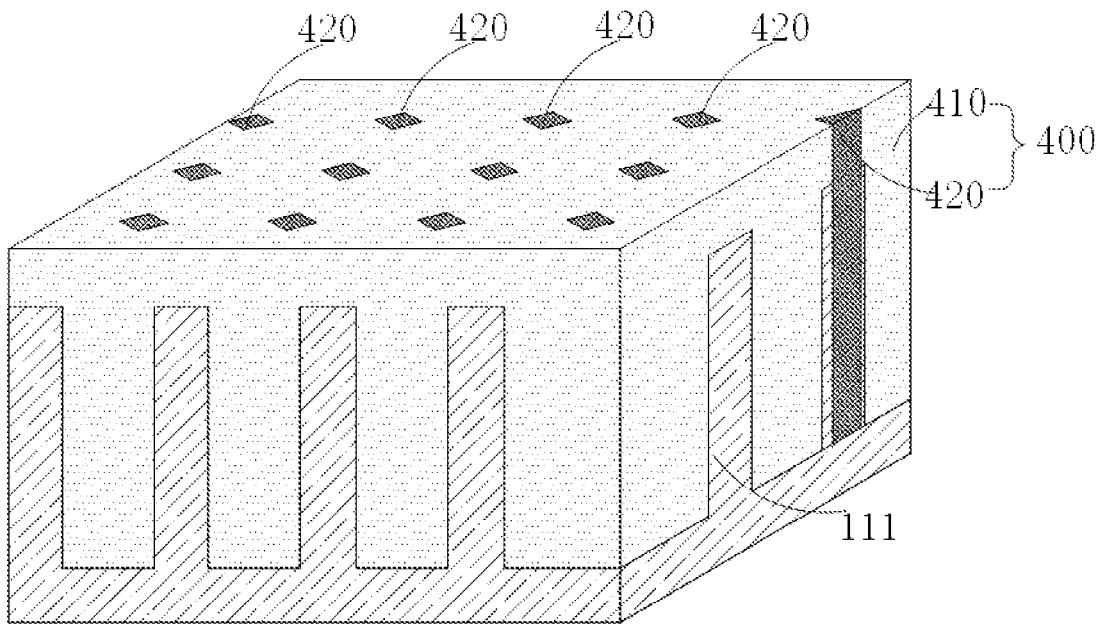
FIG. 18 is a schematic diagram of forming a second isolation layer according to an exemplary embodiment.

As shown in FIG. 18, referring to FIG. 17, the second isolation material is deposited by using any one of the ALD process, the CVD process, or the PVD process, to form the second isolation layer 420, where the second isolation layer 420 fills the second shallow trenches 130 and covers the first isolation layer 410. The second isolation material may be one of silicon oxide, silicon nitride, or silicon oxynitride. The first isolation material and the second isolation material may be the same or different.

Figure 19:
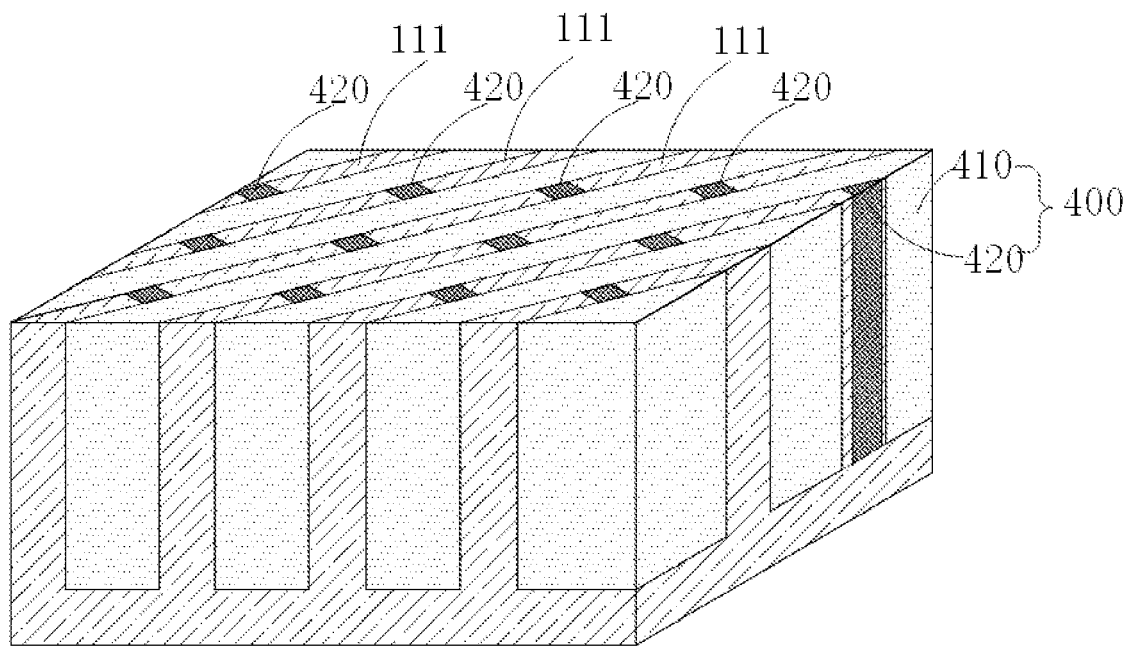
FIG. 19 is a schematic diagram of forming an isolation structure according to an exemplary embodiment.

Then, as shown in FIG. 19, referring to FIG. 18, the first isolation layer 410 and the second isolation layer 420 above the top surface of the target layer 100 are removed through etching, and the reserved first isolation layer 410 and the reserved second isolation layer 420 jointly form an STI structure 400. A top surface of the STI structure 400 is flush with a top surface of the active region 111.

In this embodiment, the target layer is etched into the independently disposed active regions, thereby reducing difficulty of forming the active regions and forming smaller active regions. This embodiment has a lower requirement on resolution accuracy of a photolithography process, reduces process difficulty and process costs, and is suitable for forming an IC with a high degree of integration.

In this embodiment, the STI structure is formed by using two different deposition processes. In the two deposition processes, different filling materials can be selected based on depth-to-width ratios of the first shallow trench and the second shallow trench, to ensure that the first shallow trench and the second shallow trench are filled with the isolation material, ensure that the formed STI structure is highly compact, stable, and well electrically isolated to better avoid a short circuit in the active region, ensure that the semiconductor structure has good electrical performance, and avoid a problem that an isolation effect of the STI structure is reduced because some regions of the trench between the active regions are not sufficiently filled due to a complex shape of the trench.

According to an exemplary embodiment, as shown in FIG. 2, compared with the foregoing embodiment, this embodiment further includes the following steps.

Step S290: Form a plurality of word lines, where each of the word lines extends along a fourth direction and runs through a plurality of active regions in an extension direction of the word line, and the word lines are spaced apart from each other.

The second direction D2 intersects the third direction D3 at a first included angle α1, the first direction D1 intersects the fourth direction D4 at a second included angle α2, and a relationship between the first included angle α1 and the second included angle α2 is as follows:

$$\cos\alpha 1 = \frac{9 - (\tan\alpha 2)^2}{9 + (\tan\alpha 2)^2}$$

where the first included angle is α1, and the second included angle is α2.

Figure 21:
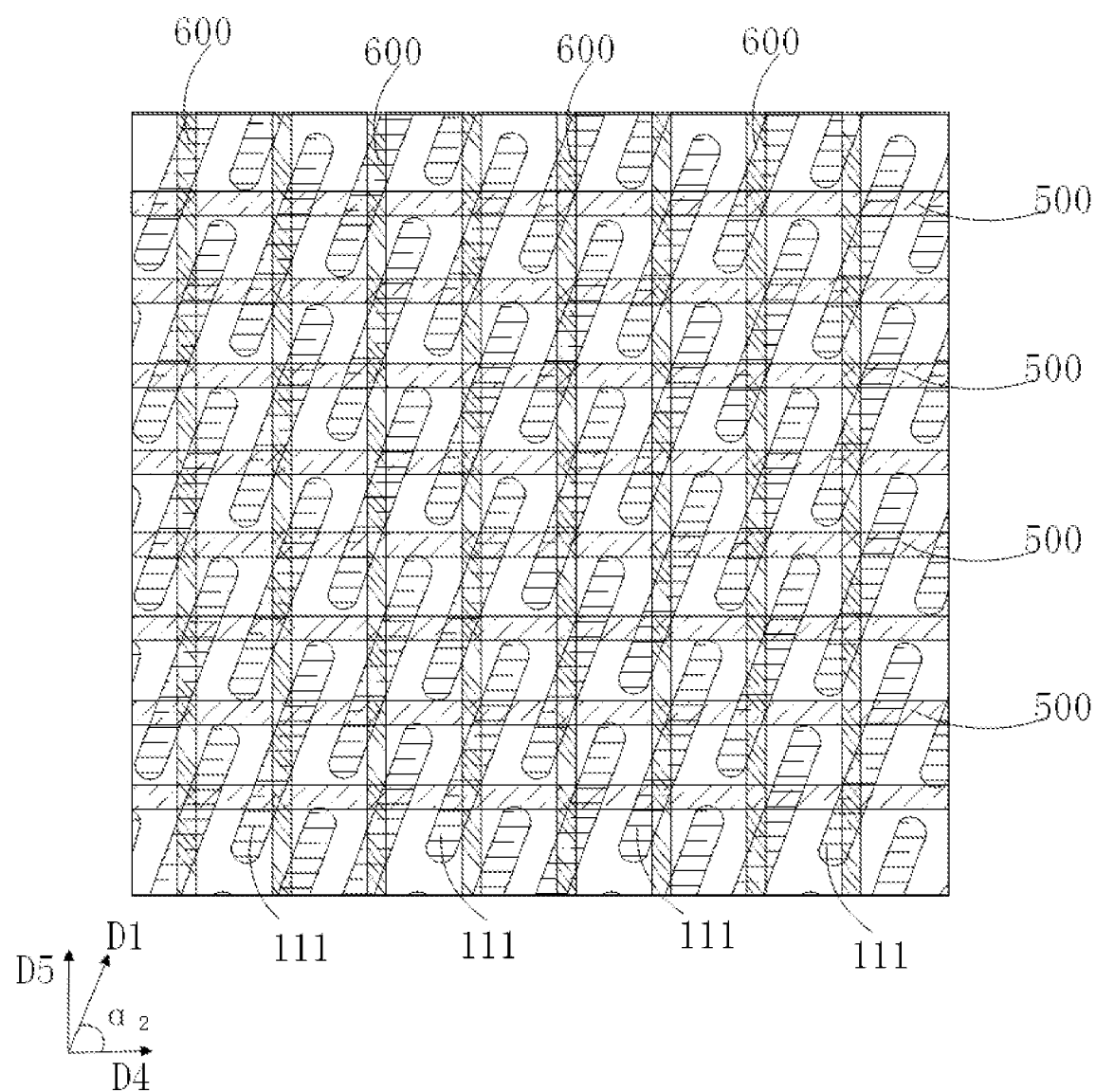
FIG. 21 is a top view of forming a word line and a bit line according to an exemplary embodiment.

As shown in FIG. 21, referring to FIG. 20, when the word line 500 is formed, a word line mask is first formed. The word line mask covers a part of the active regions 111 and a top surface of a part of the STI structure 400, and the word line mask extends along the fourth direction D4. The active regions 111 and the STI structure 400 are etched based on the word line mask to form a word line trench. The word line trench runs through the active regions 111 along the fourth direction D4, and each active region 111 is run through by two word line trenches. After that, the word line 500 is formed in the word line trench.

Step S300: Form a bit line, where the bit line covers top surfaces of a part of the active regions and a top surface of a part of the STI structure, the bit line extends along a fifth direction, and the fifth direction is perpendicular to the fourth direction.

As shown in FIG. 21, referring to FIG. 20, a plurality of bit lines 600 are formed on the top surfaces of the active regions 111 and the STI structure 400. Each of the bit lines 600 extends along the fifth direction D5, and the bit lines 600 are equally spaced apart in the fourth direction D4.

A length and an arrangement manner of the active region formed in this embodiment can meet a manufacturing requirement of other electronic components. In this embodiment, the word line and the bit line are formed in a patterned target layer, and settings of the word line, the bit line, and the active region meet a manufacturing requirement of a DRAM.

According to an exemplary embodiment, this embodiment describes an implementation of step S220. During the implementation, the forming a plurality of initial mask patterns on a top surface of the target layer further includes the following step:

defining disposition directions of the to-be-formed first line structure 210 and second line structure 220 based on the target layer 100. This step is performed before the cross structure 200 is formed on the target layer 100.

This exemplary embodiment is described by a process of forming the active region 111. Therefore, in the semiconductor field, during manufacturing of the DRAM, after the active region 111 is formed, a process of forming the word line 500 running through the active regions 111 is included.

In this embodiment, referring to FIG. 21, the word line 500 formed subsequently extends along the fourth direction D4. In a plane parallel to the top surface of the target layer 100, the first direction D1 intersects the fourth direction D4 intersect at the second included angle α2. In this embodiment, the second included angle α2 is an acute angle. For example, the second included angle α2 may be 50° to 85°. For example, the second included angle α2 may be 50°, 53°, 56°, 59°, 63°, 66°, 69°, 74°, 75°, 77°, 79°, 81°, 83°, or 85°.

In this step, the fourth direction D4 in which the word line 500 is disposed in a subsequent manufacturing process is taken as an X axis, and the first direction D1 along which the active region 111 extends is taken as a Y axis, to establish a coordinate system XOY. The coordinate system XOY established in this embodiment is an oblique coordinate system. After that, extension directions of the to-be-formed first line structure 210 and second line structure 220 are determined based on the coordinate system XOY.

Figure 22:
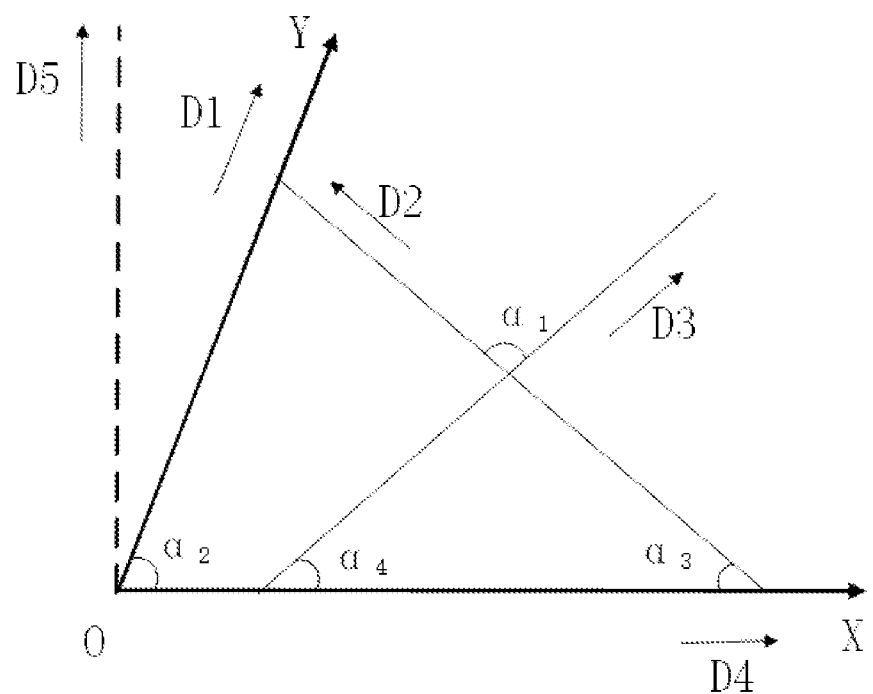
FIG. 22 is a schematic diagram of a constructed coordinate system according to an exemplary embodiment.

In this embodiment, the extension direction of the to-be-formed first line structure 210 is defined as the second direction D2, and the extension direction of the to-be-formed second line structure 220 is defined as the third direction D3. The second direction D2 intersects the third direction D3 at the first included angle α1. In this embodiment, the first included angle α1 is 70° to 95°. For example, the first included angle may be 70°, 72°, 75°, 77°, 79°, 82°, 85, 88°, 90°, 92°, or 95°. As shown in FIG. 22, the second direction D2 obliquely intersects the first direction D1, and the second direction D2 obliquely intersects the fourth direction D4. An included angle between the second direction D2 and the fourth direction D4 is a third included angle α3, and the third included angle α3 is 30° to 50°. For example, the third included angle α3 may be 30°, 32°, 34°, 36°, 37°, 39°, 41°, 45°, or 50°. As shown in FIG. 22, the third direction D3 obliquely intersects the first direction D1, and the third direction D3 obliquely intersects the fourth direction D4. An included angle between the third direction D3 and the fourth direction D4 is a fourth included angle α4, and the fourth included angle α4 is 30° to 50°. For example, the fourth included angle α4 may be 30°, 32°, 34°, 36°, 37°, 39°, 41°, 45°, or 50°.

The first included angle α1 equals a sum of the third included angle α3 and the fourth included angle α4. For example, if the first included angle α1 is 80° and the third included angle α3 is 30°, the fourth included angle α4 is 50°. In this embodiment, the third included angle α3 equals the fourth included angle α4. For example, the first included angle α1 is 82°, the third included angle α3 is 41°, and the fourth included angle α4 is 41°. The relationship between the first included angle α1 and the second included angle α2 is as follows:

$$\cos\alpha 1 = \frac{9 - (\tan\alpha 2)^2}{9 + (\tan\alpha 2)^2}$$

In this embodiment, the extension direction of the to-be-formed first line structure and a disposition direction and an included angle of the second line structure are defined based on the extension direction of the to-be-formed active region and the extension direction of the word line in the subsequent word line manufacturing process. In this way, the initial mask patterns are formed and arranged in the rows along the first direction to ensure that the projection of the subsequently formed second mask pattern on the target layer can be divided into the independently disposed sub-patterns by the projection of the first mask pattern in the extension direction of the second mask pattern on the target layer. An arrangement of the active region formed based on the first mask pattern and the second mask pattern meets the manufacturing requirement of the DRAM.

An exemplary embodiment provides a semiconductor structure. The semiconductor structure in this embodiment is manufactured according to the manufacturing method of a semiconductor structure in the above embodiments. The semiconductor structure in this embodiment may be a memory chip. The memory chip can be used in a DRAM. However, the memory chip may alternatively be applied in a static random-access memory (SRAM), a flash memory (flash EPROM), a ferroelectric random-access memory (FRAM), a magnetic random access memory (MRAM), a phase change random-access memory (PRAM), or the like.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer"

indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

According to the manufacturing method of a semiconductor structure and the semiconductor structure provided in the embodiments of the present disclosure, a target layer is etched by second mask patterns and first mask patterns as a mask separately, to form a more sophisticated repetitive structure with a higher density. This reduces difficulty of forming the repetitive structure and is conducive to forming an IC with a high degree of integration.

What is claimed is:

1. A manufacturing method of a semiconductor structure, comprising:
   providing a target layer;
   forming a plurality of first mask patterns on a top surface of the target layer, wherein any two adjacent ones of the first mask patterns are spaced apart in a first direction;
   forming a plurality of second mask patterns above the target layer, wherein each of the second mask patterns extends along the first direction, the second mask patterns are spaced apart from each other, and each of the second mask patterns covers at least a part of a top surface of each of the first mask patterns and a part of the top surface of the target layer in an extension direction of the second mask pattern;
   performing a first etching on the target layer based on the second mask patterns; and
   performing a second etching on the target layer based on the first mask patterns.

2. The manufacturing method of a semiconductor structure according to claim 1, wherein the forming a plurality of first mask patterns on a top surface of the target layer comprises:
   forming a cross structure on the target layer, wherein the cross structure comprises an overlapping region;
   removing a part of the cross structure to reserve a part of the overlapping region, and forming a plurality of initial mask patterns in the reserved overlapping region; and
   removing a partial structure of each of the initial mask patterns, wherein a reserved partial structure of each of the initial mask patterns forms the first mask pattern.

3. The manufacturing method of a semiconductor structure according to claim 2, wherein the forming a cross structure on the target layer comprises:
   forming a plurality of first line structures, wherein each of the first line structures extends along a second direction, the first line structures are spaced apart in a direction perpendicular to the second direction, and the first direction obliquely intersects the second direction;
   forming a plurality of second line structures, wherein the second line structures are located above the first line structures and extend along a third direction, the second line structures are spaced apart in a direction perpendicular to the third direction, and the first direction obliquely intersects the third direction; and
   forming the cross structure jointly by the first line structures and the second line structures, wherein overlapping portions of the first line structures and the second line structures form the overlapping region.

4. The manufacturing method of a semiconductor structure according to claim 2, wherein the forming a plurality of second mask patterns above the target layer comprises:
   forming a second mask material layer, wherein the second mask material layer covers the initial mask patterns and an exposed top surface of the target layer; and
   removing a part of the second mask material layer to form the plurality of second mask patterns extending along the first direction, wherein any two adjacent ones of the second mask patterns are spaced apart by a first trench in a direction perpendicular to the first direction.

5. The manufacturing method of a semiconductor structure according to claim 3, wherein projection of each of the second mask patterns on the target layer is divided into a plurality of independently disposed sub-patterns by projection of the first mask pattern in the extension direction of the second mask pattern on the target layer.

6. The manufacturing method of a semiconductor structure according to claim 5, wherein the performing a first etching on the target layer based on the second mask patterns comprises:
   removing a part of the target layer exposed by the second mask patterns, etching a reserved part of the target layer to form a plurality of active strips extending along the first direction, wherein any two adjacent ones of the active strips are spaced apart by a first shallow trench in a direction perpendicular to the first direction.

7. The manufacturing method of a semiconductor structure according to claim 6, the manufacturing method further comprises:
   depositing a first isolation material to form a first isolation layer, wherein the first isolation layer fills the first shallow trenches and covers the first mask patterns and top surfaces of the active strips exposed by the first mask patterns.

8. The manufacturing method of a semiconductor structure according to claim 7, the manufacturing method further comprises:
   planarizing a top surface of the first isolation layer to expose top surfaces of the first mask patterns.

9. The manufacturing method of a semiconductor structure according to claim 8, wherein the performing a second etching on the target layer based on the first mask patterns comprises:
   removing the first mask patterns and a part of the active strips covered by the first mask patterns, wherein a plurality of independently disposed active regions are formed in a reserved part of the active strips, the active regions extend along the first direction, and two adjacent ones of the active regions are spaced apart by a second shallow trench in the first direction.

10. The manufacturing method of a semiconductor structure according to claim 9, the manufacturing method further comprises:
    filling the second shallow trenches with a second isolation material to form a second isolation layer.

11. The manufacturing method of a semiconductor structure according to claim 10, the manufacturing method further comprises:
    removing the first isolation layer and the second isolation layer above the top surface of the target layer, wherein the reserved first isolation layer and the reserved second isolation layer jointly form a shallow trench isolation (STI) structure.

12. The manufacturing method of a semiconductor structure according to claim 10, wherein the first isolation material and the second isolation material are the same or different.

13. The manufacturing method of a semiconductor structure according to claim 9, the manufacturing method further comprises:
    forming a plurality of word lines, wherein each of the word lines extends along a fourth direction and runs through a plurality of active regions in an extension direction of the word line, and the word lines are spaced apart from each other.

14. The manufacturing method of a semiconductor structure according to claim 13, wherein the second direction intersects the third direction at a first included angle, the first direction intersects the fourth direction at a second included angle, and a relationship between the first included angle and the second included angle is as follows:

$$\cos\alpha 1 = \frac{9 - (\tan\alpha 2)^2}{9 + (\tan\alpha 2)^2}$$

wherein the first included angle is $\alpha 1$, and the second included angle is $\alpha 2$.

* * * * *